DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED OCTOBER 13, 1970

879 O.G. 367

T879,011

PHOTOGRAPHIC ELEMENT AND METHOD OF MAKING ETCHED PRINTING PLATE

Edward C. Yackel, Pittsford, N.Y.
(% Kodak Park Works, Rochester, N.Y. 14650)

Filed May 4, 1970, Ser. No. 34,555
Int. Cl. G03c *1/78, 5/00;* G03f *7/00*
U.S. Cl. 96—36.3
No Drawing. 10 Pages Specification

A photographic element useful for making an etched printing plate comprises a support such as cellulose ester, etc., and a humectant such as glycerol, etc., containing gelatino-silver halide emulsion layer provided directly on an unsubbed support without the interposition of any intermediate layers. The emulsion also contains a tanning type 1,2-dihydroxybenzene developing agent. After exposure to an original, the emulsion layer is pressed into contact with a wet metal plate. After water from the plate is absorbed into the gelatin layer, the cellulose ester support layer is removed leaving the exposed emulsion layer adhered to the metal plate. The emulsion is then tan developed by contacting it with an alkaline activating solution, and the plate is etched. Etching can be accomplished by first washing away unhardened areas of the developed emulsion or by simply treating the developed emulsion with an etching solution which penetrates the unhardened areas more rapidly.